United States Patent [19]
Hayashi

[11] Patent Number: 5,550,427
[45] Date of Patent: Aug. 27, 1996

[54] SUBSTRATE CONTACT ELECTRODE HAVING REFRACTORY METAL BUMP STRUCTURE WITH REINFORCEMENT SIDEWALL FILM

[75] Inventor: Yoshihiro Hayashi, Tokyo, Japan

[73] Assignee: NEC Corporation, Tokyo, Japan

[21] Appl. No.: 404,839

[22] Filed: Mar. 15, 1995

Related U.S. Application Data

[63] Continuation of Ser. No. 270,219, Jul. 1, 1994, abandoned, which is a continuation of Ser. No. 978,740, Nov. 19, 1992, abandoned.

[30] Foreign Application Priority Data

Nov. 19, 1991 [JP] Japan .................. 3-302955

[51] Int. Cl.$^6$ ........................... H01L 29/00
[52] U.S. Cl. .................. 313/355; 257/737; 257/763
[58] Field of Search .................. 313/352, 355, 313/509; 257/737, 750, 763, 765

[56] References Cited

U.S. PATENT DOCUMENTS

| | | | |
|---|---|---|---|
| 3,942,187 | 3/1976 | Gelsing et al. | 257/737 |
| 4,268,849 | 5/1981 | Gray et al. | 257/737 |
| 4,951,121 | 8/1990 | Furukawa et al. | 257/763 |
| 5,108,950 | 4/1992 | Wakabayashi et al. | 257/763 |
| 5,134,460 | 7/1992 | Brady et al. | 257/737 |
| 5,202,579 | 4/1993 | Fujii et al. | 257/763 |

FOREIGN PATENT DOCUMENTS

| | | | |
|---|---|---|---|
| 5250167 | 4/1977 | Japan | 257/737 |
| 01291450 | 11/1989 | Japan | 257/763 |
| 02139933 | 5/1990 | Japan | 257/737 |

OTHER PUBLICATIONS

"Tungsten Plug–In Wiring Structure For High Density Three Dimensional Devices", by K. Kajiyana et al., Jun. 11–12, 1991 VMIC Conference, IEEE. pp. 130–136.

*Primary Examiner*—Sandra L. O'Shea
*Assistant Examiner*—Matthew J. Esserman
*Attorney, Agent, or Firm*—Burns, Doane, Swecker & Mathis, LLP

[57] ABSTRACT

A fine substrate contact electrode (bump) made of a refractory metal having low resistance and sufficient mechanical strength is fabricated on a wiring substrate with a polyimide resin film serving as an electrically insulating layer. It is not the entire surface of the contact electrode that is covered with a high-resistance oxide film since the top surface of the refractory metal such as tungsten is covered with an oxidation-resistant metal film. The substrate contact electrode has a sufficient mechanical strength since the side of the tungsten bump is surrounded by a side wall reinforcement film even where the tungsten formed by the blanket chemical vapor deposition method is polycrystalline. Since the polyimide film is previously embedded before the substrate contact electrode is fabricated, the electrode can be formed on the polyimide film having a desired thickness on the entire substrate surface.

4 Claims, 6 Drawing Sheets

SUBSTRATE CONTACT ELECTRODE HAVING REFRACTORY METAL BUMP STRUCTURE WITH REINFORCEMENT SIDEWALL FILM

This application is a continuation of application Ser. No. 08/270,219, filed Jul. 1, 1994, now abandoned, which is itself a continuation of application Ser. No. 07/978,740, filed Nov. 19, 1992, now abandoned.

BACKGROUND OF THE INVENTION (1) Field of the Invention

The present invention relates to a substrate contact electrode and a method of fabricating the same.

(2) Description of the Related Art

One of the previously known method of fabricating a contact electrode for a substrate includes a method using a tungsten bump which is made of refractory metal formed through a selective tungsten CVD (Chemical Vapor Deposition) method and etch-back of a polyimide applied film. FIGS. 1A–1F show schematic sectional views of a conventional structure for explaining the sequential steps for fabrication a tungsten bump on an MoSi$_2$/Al wiring by the above tungsten bump method.

Referring to FIGS. 1A–1F, firstly, an SiO$_2$ film 5 is formed on an MoSi$_2$/Al wiring 15 by the CVD method, and a contact hole or through-hole 6 is formed in SiO$_2$ film 5 (FIGS. 1A and 1B). Tungsten (W) 16 is selectively filled in the through-hole 6 by the tungsten selective CVD method (FIG. 1C) and, thereafter, the SiO$_2$ film 5 on the MoSi$_2$/Al wiring 15 is etched away by the RIE (Reactive Ion Etching) method (FIG. 1D). Further, polyimide 4 is applied on the surface (FIG. 1E), and a part of the polyimide film 4 is etched back to provide a structure in which the bottom of a tungsten bump 17 formed on the MoSi$_2$/Al wiring 15 is embedded in the polyimide film 4 (FIG. 1F).

The above fabricating method has the following problems to be solved.

In the first place, in order to obtain a tall tungsten bump 17, tungsten 16 must be filled in a deep through-hole 6 by the tungsten selective CVD method as shown in FIG. 1C. However, in the filling of the tungsten, selectivity of tungsten deposition is lost so that tungsten 18 may be deposited on a part of the SiO$_2$ film 5 as shown in FIG. 2A. As a result, in the subsequent etching for the SiO$_2$ film 5, the tungsten deposited partly on the SiO$_2$ film serves as a mask, and thus a part of the SiO$_2$ film is left like a stick 19 as shown in FIG. 2B.

Secondly, in etching back a part of the polyimide applied film using oxygen plasma as shown in FIG. 1F, because of absence of an etching stopper, it is difficult to control the thickness of the film to be left. Further, in the oxygen plasma etching, a high resistance oxide film will be formed on the entire surface of the tungsten bump 17.

Thirdly, the tungsten formed by the tungsten selective CVD method is polycrystalline so that the mechanical strength of the resultant tungsten bump 17 is weak.

In the fourth place, where the tungsten bump 17 is formed according to the process steps of FIGS. 1A–1F on the semiconductor substrate having a convex portion 14 (shown in FIG. 3) on its surface, the substantial or effective height of the bump becomes low by the height of the convex portion.

SUMMARY OF THE INVENTION

An object of the present invention is to provide a tungsten bump with high reliability free from the above disadvantages of the prior art, and to provide an improved method of fabricating the same.

According to one aspect of the invention, there is provided a substrate contact electrode formed on a wiring layer which is formed on a substrate, the substrate contact electrode comprising:

a contact hole which is formed on the wiring layer with a surface of the wiring layer being covered with a polyimide resin layer and which penetrates through the polyimide resin layer to reach the wiring layer;

a bump which is composed of a barrier metal film and a refractory metal film and which is formed on the contact hole;

an oxidation-resistant metal film which covers a top surface of the bump; and a reinforcement film of insulating material which partially covers a side portion of the bump.

According to another aspect of the invention, there is provided a method of fabricating a substrate contact electrode on a wiring layer which is formed on a substrate and which is covered with a polyimide resin layer, the method comprising the steps of:

forming an insulating layer on the polyimide resin layer;

forming a contact hole which penetrates through the insulating layer and the polyimide resin layer to reach the wiring layer;

depositing a barrier metal layer on a exposed surface of the layers thus far formed on the substrate;

forming by a CVD method a refractory metal layer which fills the contact hole and covers an entire surface of the barrier metal layer;

depositing an oxidation-resistant metal layer on the refractory metal film;

forming a metal bump by partially etching the barrier metal layer, the refractory metal layer and the oxidation-resistant metal layer thereby leaving in place a region of the contact hole and a region surrounding the contact hole; and forming an insulating film by etching the insulating layer using as a mask the metal bump thereby leaving the insulating film at a side portion of the metal bump.

In the present invention, in place of the selective filling step for a through-hole by the selective CVD method (FIG. 1C), the blanket CVD method is used to perform the filling of the contact hole and to form a refractory metal film so as to cover the entire substrate surface, and an insulating film is formed after the refractory metal film deposited on other portion than the contact electrode portion is completely removed by etching. For this reason, any stick-like insulating film, which is attributable to the refractory metal particles acting as a mask, will not be left at any other portion than the contact electrode portion.

Since the process according to the present invention does not include the oxygen plasma etching for a polyimide layer and an oxidation-resistant metal film is formed on the top surface of the bump, there is no possibility for the entire bump surface to be covered with a high-resistance oxide film. Further, the bump is mechanically strengthened by the insulating material surrounding the sides of the bump.

Furthermore, where the bump is formed on a metal pedestal, any convex surface of a semiconductor substrate can be absorbed by the provision of such pedestal so that the height of the contact electrode is in substance not lowered.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments according to the present invention will be explained with reference to the accompanying drawings. It should be noted, that, throughout the following explanation, similar reference symbols or numerals refer to the same or similar elements in all figures of the drawings.

Figure 4:
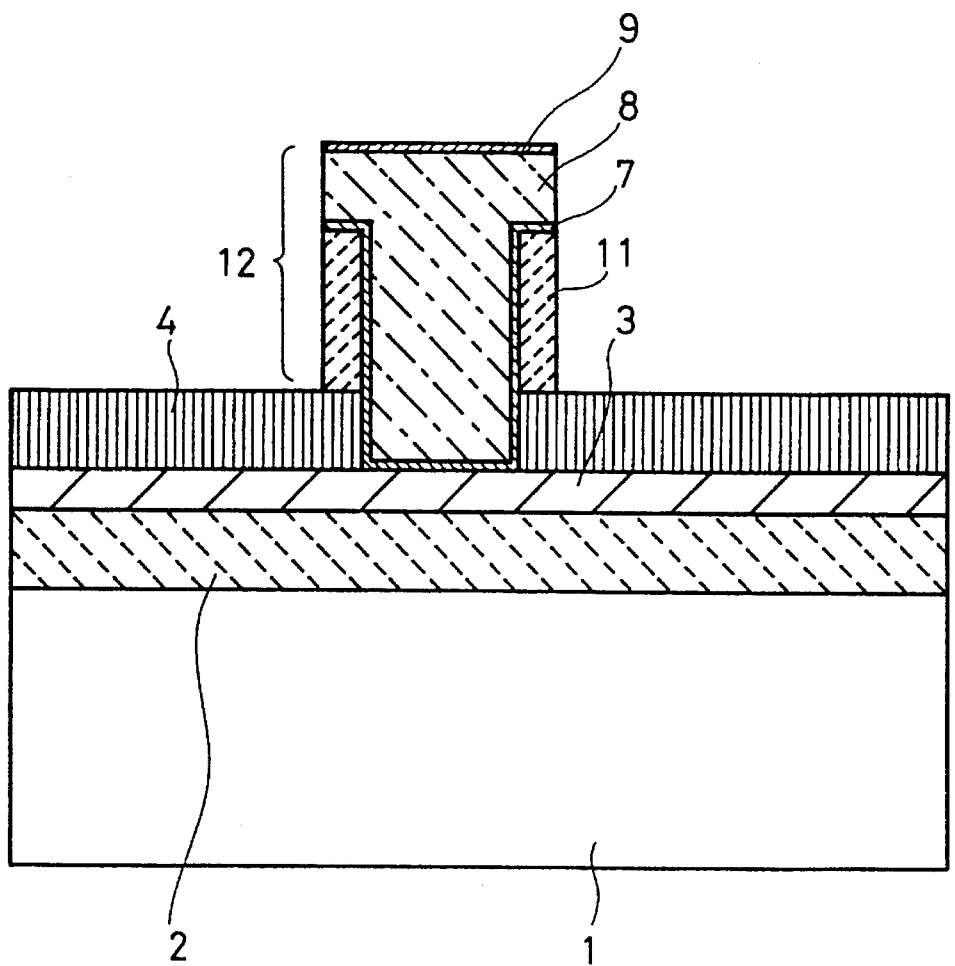
FIG. 4 is a sectional view of a substrate contact electrode formed according to a first embodiment of the present invention.

A substrate contact electrode of a first embodiment according to the present invention is shown in FIG. 4. As seen from FIG. 4, a passivation oxide film 2, an aluminum (Al) wiring layer 3 and a polyimide resin layer 4 are successively formed on a silicon (Si) substrate 1 in which a circuit (not shown) is formed. A bump or protrusion 12 is further formed through a contact hole. A tungsten (W) bump 8 made of a refractory metal layer is connected with the Al wiring layer 3 through a barrier metal layer 7 which is a Ti/TiW or Ti/TiN layer. A gold (Au) thin film 9 which is oxidation-resistant metal is formed on the top surface of the tungsten bump 8. The side of the tungsten bump 8 is surrounded by a reinforcement film 11 ($SiO_2$) which is an insulating material for strengthening the tungsten bump 8. The oxidation-resistant metal film may be a noble metal such as platinum (Pt).

Figure 5:
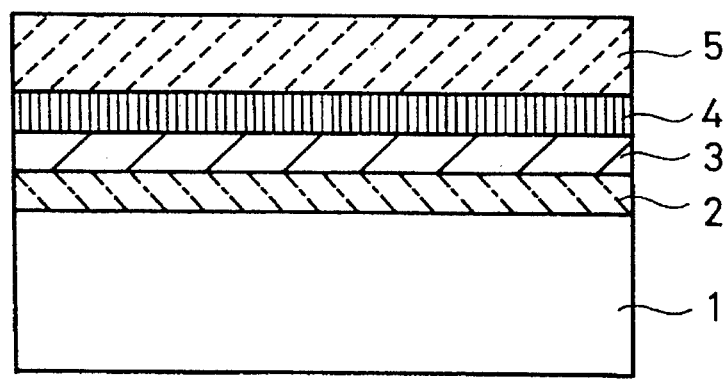
FIGS. 5 to 10 are sectional views showing the respective steps in the process for fabricating the substrate contact electrode according to the first embodiment of the present invention shown in FIG. 4.
Figure 6:
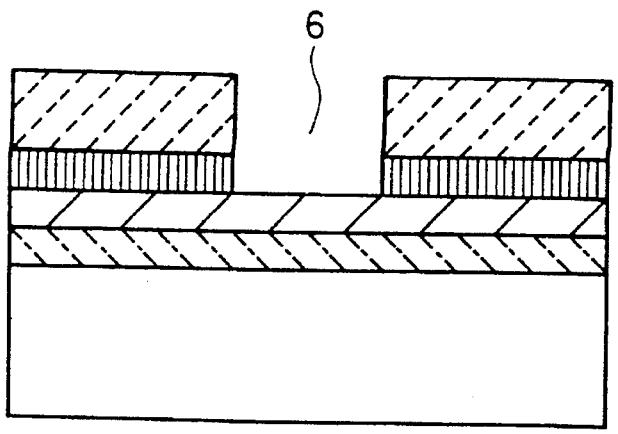

Now, referring to FIGS. 5 to 10, an explanation will be given of the sequential steps in the process of fabricating the contact electrode having the sectional structure as shown in FIG. 4. First, a polyimide resin film 4 having a constant thickness (1~5 μm) is deposited by spin-coating method on the entire surface of the Al wiring layer 3 which is formed on the passivation oxide film 2. Subsequently, by the ECR plasma ECR-CVD method, an oxide film ($SiO_2$ film) 5 having a thickness of 1~10 μm is formed on the entire surface of polyimide resin film 4 at low temperatures (200°~400° C.) where the polyimide layer 4 is not thermally decomposed (FIG. 5). Next, by photolithography and dry-etching, a through-hole or contact hole 6 which penetrates through the oxide film and the polyimide resin layer to reach the Al wiring layer 3 is formed (FIG. 6). The through-hole is 0.5~3 μm in diameter.

Figure 7:
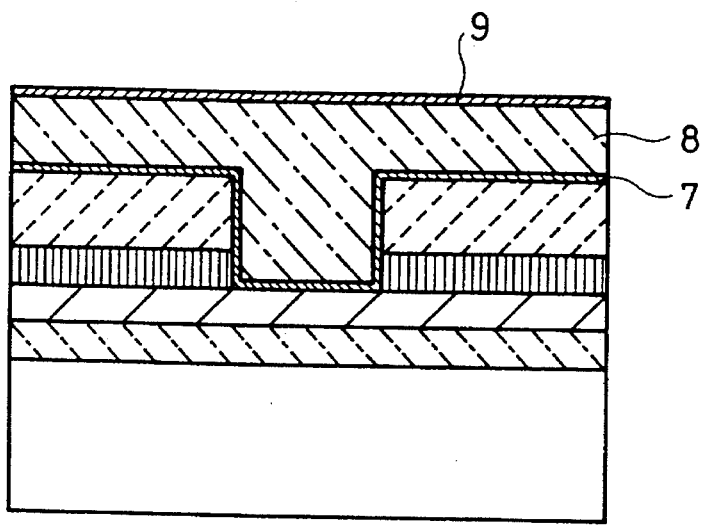

In order to reduce contact resistance and restrain intermetal reaction, a barrier metal film 7 which is made of Ti/TiW or Ti/TiN is deposited by sputtering. The through-hole 6 is filled with tungsten 8 which also extends onto the entire Si substrate surface, by the blanket tungsten-CVD method which is disclosed by K. Kajiyana et al, in Jun. 11–12, 1991 VMIC Conference, IEEE, pp 130–136. An Au film 9 is deposited by sputtering on the entire surface (FIG. 7). The blanket CVD method permits a tungsten film having a fixed thickness to be deposited over the entire Si substrate surface even with any rugged portion (or convex or concave portion). Therefore, in order to fill the through-hole 6 having a diameter of 1 μm with tungsten, a tungsten film having a thickness of 0.5 μm has only to be deposited, using tungsten growth from the side wall of the through-hole. However, as the through-hole diameter increases, a tungsten film having a large thickness in proportion to the through-hole diameter must be deposited on the surface by the blanket CVD method. This is the reason that the diameter of the through-hole 6 to be filled with tungsten (W) is set for 0.5~3 μm in this embodiment.

In this embodiment, tungsten (W) was formed by the blanket CVD method, but other metals such as Au, Cu and Al or metal silicide such as $WSi_x$ may be formed.

Figure 8:
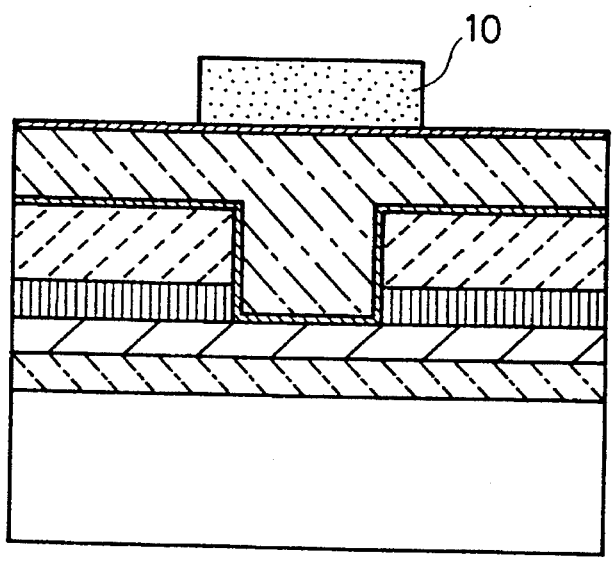
Figure 9:
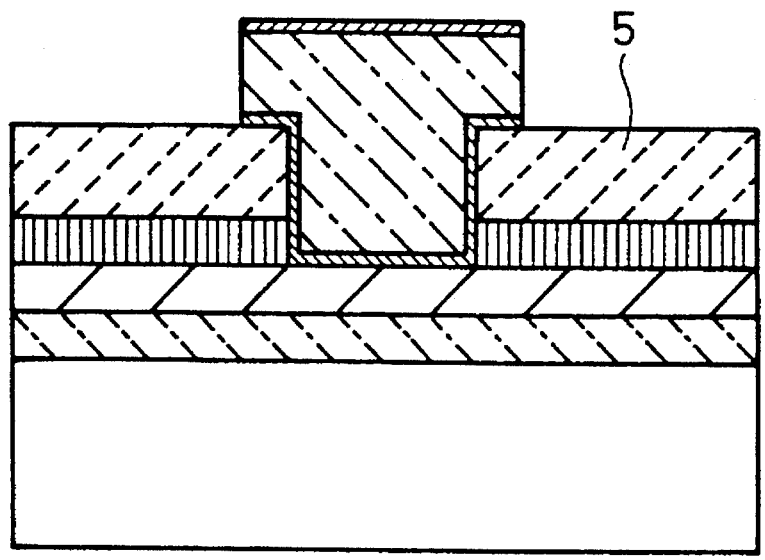

A resist pattern 10 having a larger diameter than that of the through-hole 6 is formed (FIG. 8). Using the resist-pattern 10 as a mask, the oxidation-resistant metal film 9, the tungsten film 8 and the barrier metal film 7 are dry-etched, and then the resist pattern 10 is removed by $O_2$ plasma (FIG. 9). In this case, since the surface of the tungsten film 8 has been covered with the oxidation-resistant metal film 9, this surface will not be covered with a high-resistance metal oxide film.

Figure 10:
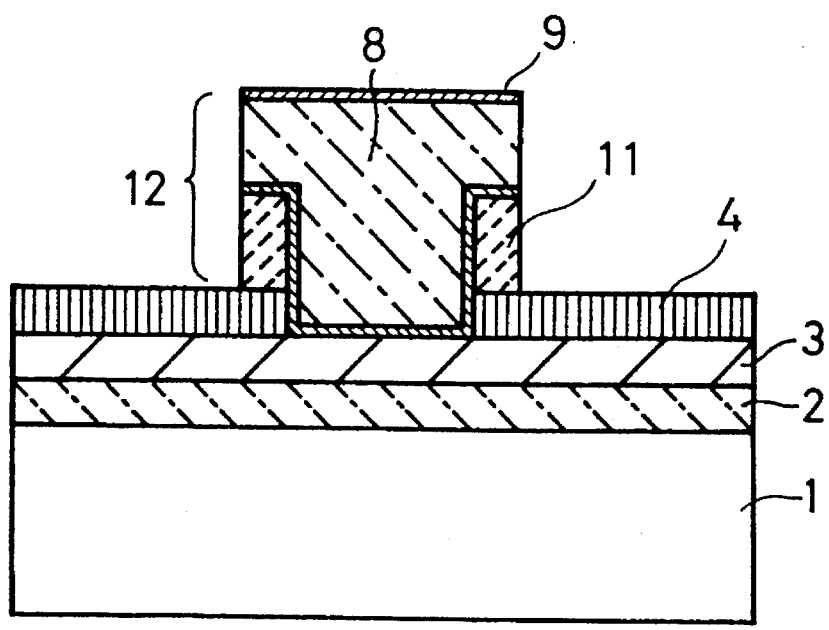

Next, the oxide film 5 is removed by dry-etching (FIG. 10). As a result, a substrate contact electrode is completed in which the contact hole 6 penetrating through the polyimide resin layer 4 is formed on the Al wiring layer 3 which is provided on the passivation oxide film 2, a bump or protrusion 12 composed of the barrier metal film 7 and the tungsten film 8 is formed on the contact hole, the surface of the tungsten film 8 is covered with oxidation-resistant metal film 9, and the side of the metal bump is partially surrounded by an oxide film 11.

Figure 1A:
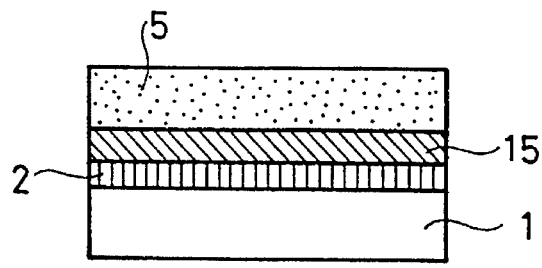
FIGS. 1A–1F are sectional views of a structure for explaining the sequential process steps of a conventional method for fabricating a tungsten bump structure.
Figure 1B:
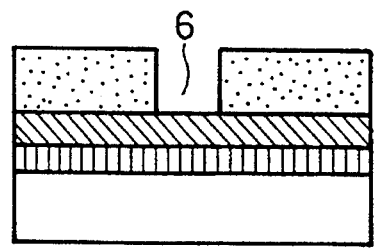
Figure 1C:
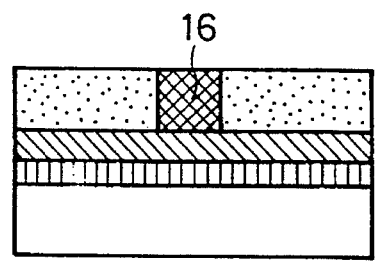
Figure 1D:
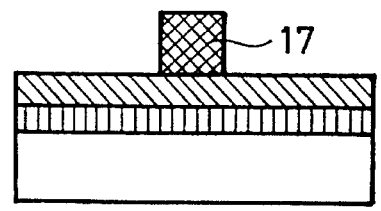
Figure 1E:
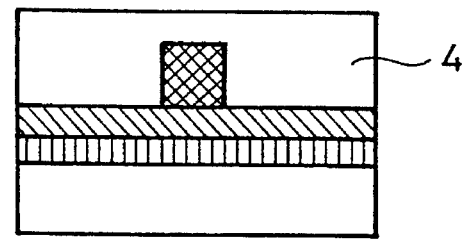
Figure 1F:
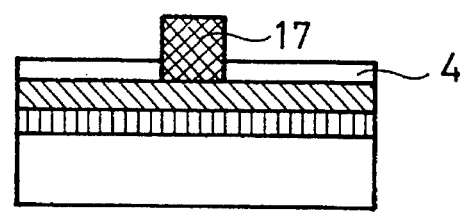
Figure 2A:
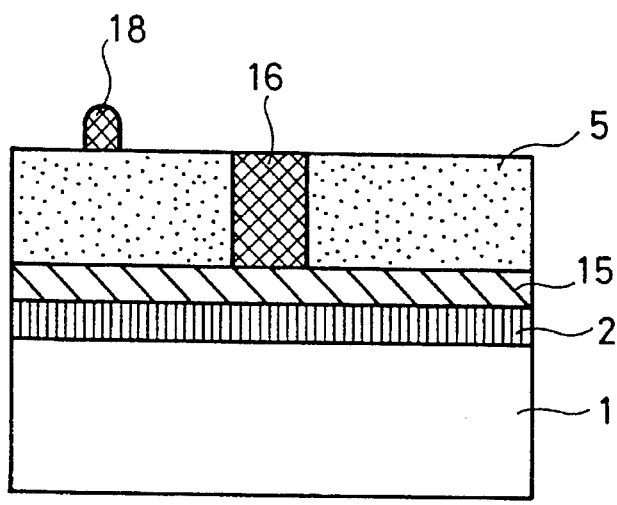
FIGS. 2A–2B are sectional views of the structure for explaining the problems involved in the conventional method.
Figure 2B:
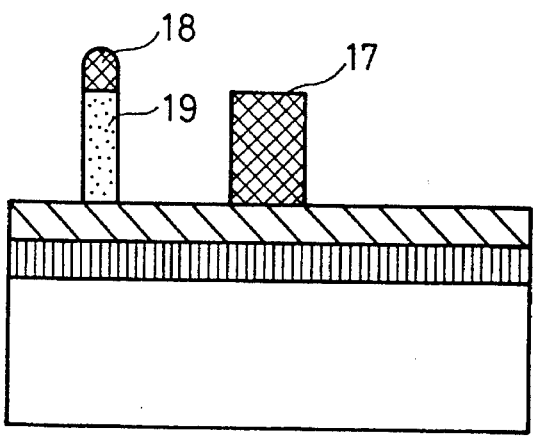
Figure 3:
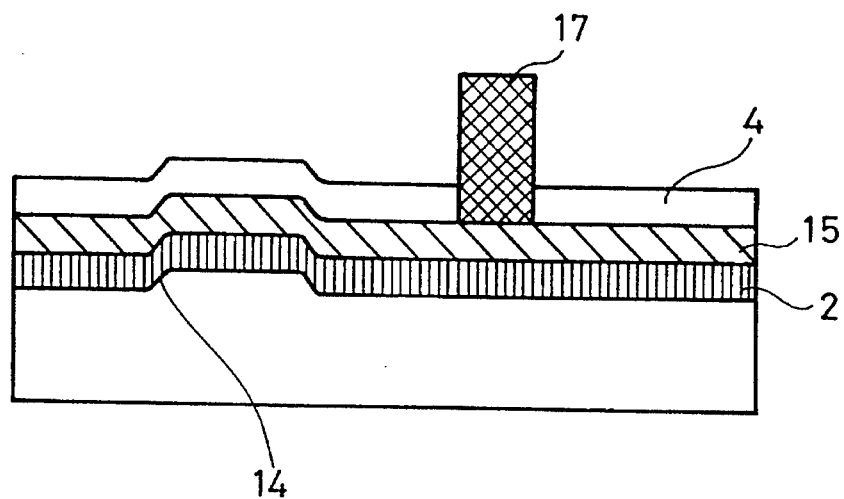
FIG. 3 is also a sectional view of the structure for explaining the problems involved in the conventional method.

The above fabricating process, in which the polyimide resin layer 4 having a uniform thickness is previously embedded as an underlying layer before the bump 12 is formed (FIG. 5), does not involve the etch-back steps (FIGS. 1E and 1F in the conventional method) for the polyimide resin layer after the contact electrode has been formed, and to can easily control the thickness of the polyimide resin layer. Also, no metal oxide film will be formed on the contact electrode by the $O_2$ plasma etch-back step.

Figure 11:
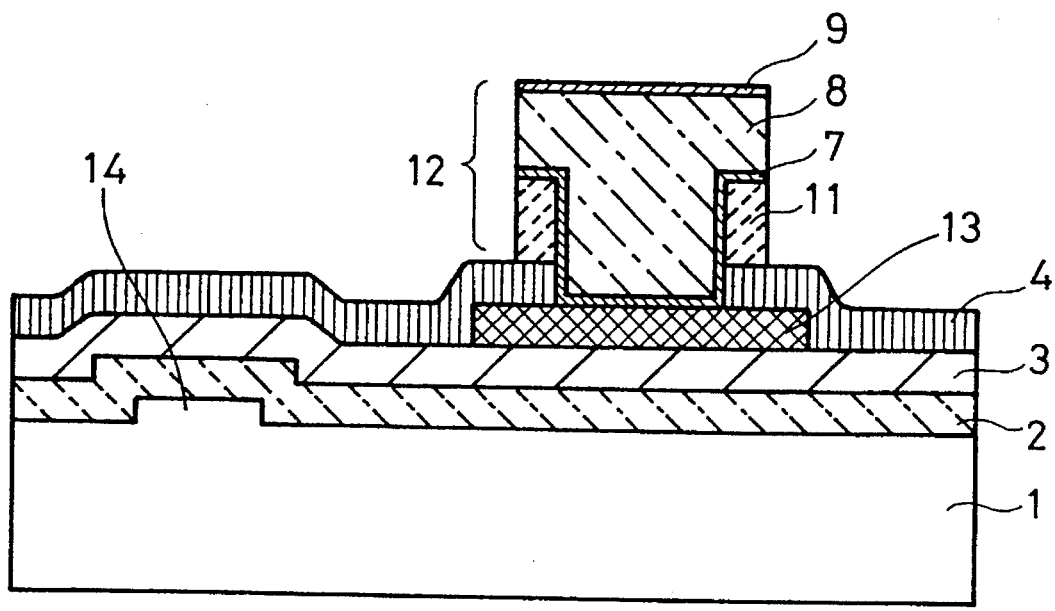
FIG. 11 is a sectional view of a structure formed according to a second embodiment of the invention, in which a pedestal is formed below the contact electrode.

FIG. 11 shows a substrate contact electrode of a second embodiment according to the present invention. In FIG. 11, like reference numerals refer to like parts in FIG. 4. In this structure, a convex or rugged portion 14 due to the presence of a semiconductor element is formed on the Si substrate. In this case, in fabricating the substrate contact electrode, a pedestal 13 made of an electrically conductive material which is taller than the convex portion is previously formed on the Al wiring layer 3, and thereafter the bump or contact electrode 12 is formed on the pedestal 13 by the respective steps shown in FIGS. 5–10. Since the contact electrode is formed on the pedestal 13, the substantive or effective height of the contact electrode will not be reduced despite the presence of the convex portion 14.

In this embodiment, in patterning the pedestal 13 by dry-etching, it is important to select the pedestal material which can have a large selectivity ratio of dry-etching with respect to Al in the underlying wiring layer. For example, in the plasma reaction gas containing fluorine (F), Al is not etched whereas W, Ti, $WSi_x$ and $TiSi_x$ are etched. Thus, if the underlying wiring layer is made of Al, it is preferably to select W, Ti, $WSi_x$ or $TiSi_x$ as the pedestal material.

In the embodiments described above, the contact electrode structure proposed was applied to a Si substrate which is a semiconductor substrate, but it can be applied to a GaAs device substrate, a ceramic circuit substrate, a glass-epoxy circuit substrate or a polyimide thin film substrate.

In accordance with the present invention, on the substrate with a polyimide resin layer formed thereon, a substrate contact electrode can be formed which is surrounded on its side by a reinforcement film and covered in its top surface with an oxidation-resistant metal film. Further, even in the case when there is a convex portion on the substrate because of the presence of, for example, a semiconductor element, the substantive or effective height of the contact electrode can be made relatively taller by providing a conductive pedestal below the contact electrode. Thus, the substrate contact electrode with low contact resistance and high reliability can be obtained.

Moreover, the fabricating method according to the present invention, which does not include an electrolytic plating step, can fabricate a fine contact electrode having a diameter of 1~10 μm without leading to pollution of the substrate due to metal ions contained in a plating solution. The method, which does not require a step of making an electrode for electrolytic plating and its removing step, can reduce the number of steps required for fabricating the contact electrode and improve the fabrication yield thereof.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A substrate contact electrode formed on a wiring layer which is formed on a passivation oxide film on a semiconductor substrate, said semiconductor substrate having a convex portion on a part of a surface thereof and said wiring layer being covered by a polyimide resin layer, said substrate contact electrode comprising:

a metal pedestal formed within said polyimide resin layer, said metal pedestal having an overall height greater than an overall height of said convex portion of said semiconductor substrate and an under surface of said metal pedestal being in contact with an upper surface of said wiring layer;

a contact hole which is formed within said polyimide resin layer and which reaches an upper surface of said metal pedestal;

a bump which is composed of a barrier metal film and a refractory metal film and which is partly formed within said contact hole and which is partly protruding from an upper surface of said polyimide resin layer;

an oxidation-resistant metal film which covers a top surface of said bump; and a reinforcement film of insulating material which partially covers a side portion of said bump.

2. The substrate contact electrode according to claim 1, wherein said oxidation-resistant metal film is a thin gold (Au) film.

3. The substrate contact electrode according to claim 1 wherein said reinforcement film is formed on top of said polyimide resin layer.

4. The substrate contact electrode according to claim 1 wherein said metal pedestal is provided beneath said bump and serves to raise the top surface of the bump relative to an upper surface of said polyimide resin layer.

* * * * *